United States Patent
Pan et al.

(10) Patent No.: US 11,848,297 B2
(45) Date of Patent: Dec. 19, 2023

(54) SEMICONDUCTOR DEVICE PACKAGES WITH HIGH ANGLE WIRE BONDING AND NON-GOLD BOND WIRES

(71) Applicant: Texas Instruments Incorporated, Dallas, TX (US)

(72) Inventors: Bo-Hsun Pan, New Taipei (TW); Chien-Chang Li, New Taipei (TW); Hung-Yu Chou, Taipei (TW); Shawn Martin O'Connor, McKinney, TX (US); Byron Lovell Williams, Plano, TX (US); Jeffrey Alan West, Dallas, TX (US); Zi-Xian Zhan, New Taipei (TW); Sheng-Wen Huang, Taipei (TW)

(73) Assignee: Texas Instruments Incorporated, Dallas, TX (US)

( * ) Notice: Subject to any disclaimer, the term of this patent is extended or adjusted under 35 U.S.C. 154(b) by 210 days.

(21) Appl. No.: 17/364,807

(22) Filed: Jun. 30, 2021

(65) Prior Publication Data
US 2023/0005874 A1    Jan. 5, 2023

(51) Int. Cl.
*H01L 23/00* (2006.01)
*H01L 23/495* (2006.01)
*H01L 25/065* (2023.01)

(52) U.S. Cl.
CPC .......... *H01L 24/48* (2013.01); *H01L 23/4952* (2013.01); *H01L 23/49575* (2013.01); *H01L 24/45* (2013.01); *H01L 24/85* (2013.01); *H01L 25/0655* (2013.01); *H01L 2224/45124* (2013.01); *H01L 2224/45139* (2013.01); *H01L 2224/45147* (2013.01); *H01L 2224/45644* (2013.01); *H01L 2224/45664* (2013.01);
(Continued)

(58) Field of Classification Search
CPC ......... H01L 24/48; H01L 24/45; H01L 24/85; H01L 23/4952; H01L 23/49575; H01L 25/0655; H01L 2224/45124; H01L 2224/45147; H01L 2224/45644; H01L 2224/48138; H01L 2224/48453; H01L 2224/48481; H01L 2224/85035
See application file for complete search history.

(56) References Cited

U.S. PATENT DOCUMENTS

| 7,229,906 B2 | 6/2007 | Babinetz et al. | |
| 2009/0189261 A1* | 7/2009 | Lim | H01L 23/49551 257/676 |

(Continued)

*Primary Examiner* — Marc Anthony Armand
(74) *Attorney, Agent, or Firm* — Dawn Jos; Frank D. Cimino

(57) ABSTRACT

In a described example, an apparatus includes: a package substrate having a die mount portion and lead portions spaced from the die mount portion; a semiconductor die over the die mount portion having bond pads on an active surface facing away from the package substrate; non-gold bond wires forming electrical connections between at least one of the bond pads and one of the lead portions of the package substrate; a bond stitch on bump connection formed between one of the non-gold bond wires and a bond pad of the semiconductor die, comprising a stitch bond formed on a flex stud bump; and dielectric material covering a portion of the package substrate, the semiconductor die, the non-gold bond wires, the stitch bond and the flex stud bump, forming a packaged semiconductor device.

20 Claims, 5 Drawing Sheets

(52) U.S. Cl.
CPC ............ *H01L 2224/48138* (2013.01); *H01L 2224/48245* (2013.01); *H01L 2224/48453* (2013.01); *H01L 2224/48463* (2013.01); *H01L 2224/48481* (2013.01); *H01L 2224/85035* (2013.01); *H01L 2224/85051* (2013.01); *H01L 2924/182* (2013.01)

(56) References Cited

U.S. PATENT DOCUMENTS

| | | | | |
|---|---|---|---|---|
| 2011/0104510 | A1* | 5/2011 | Uno | H01L 24/43 428/576 |
| 2012/0256314 | A1* | 10/2012 | Har | H01L 24/85 228/180.5 |
| 2019/0206812 | A1* | 7/2019 | Bonifield | H01L 25/50 |
| 2021/0366867 | A1* | 11/2021 | Amano | H01L 24/48 |

* cited by examiner

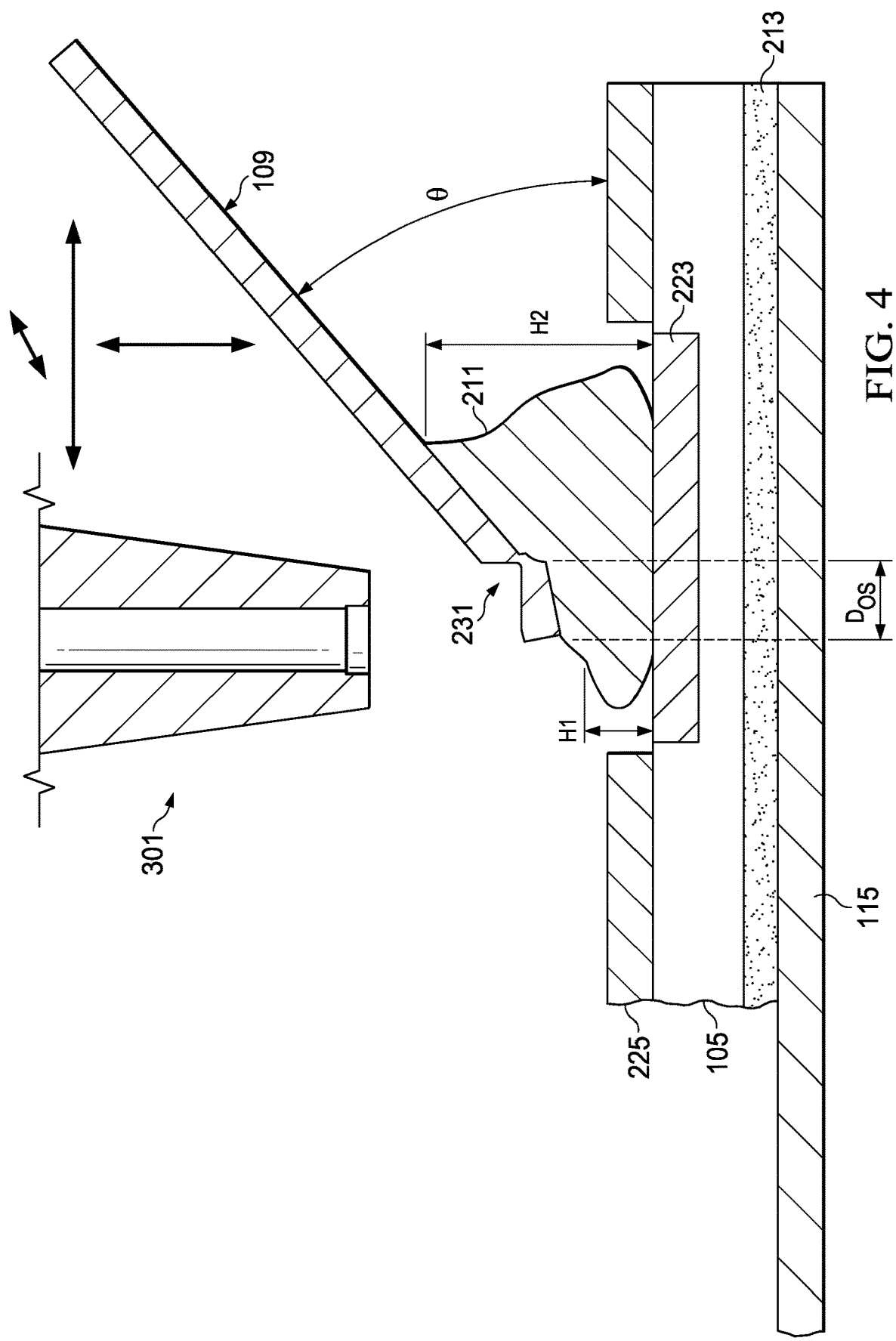

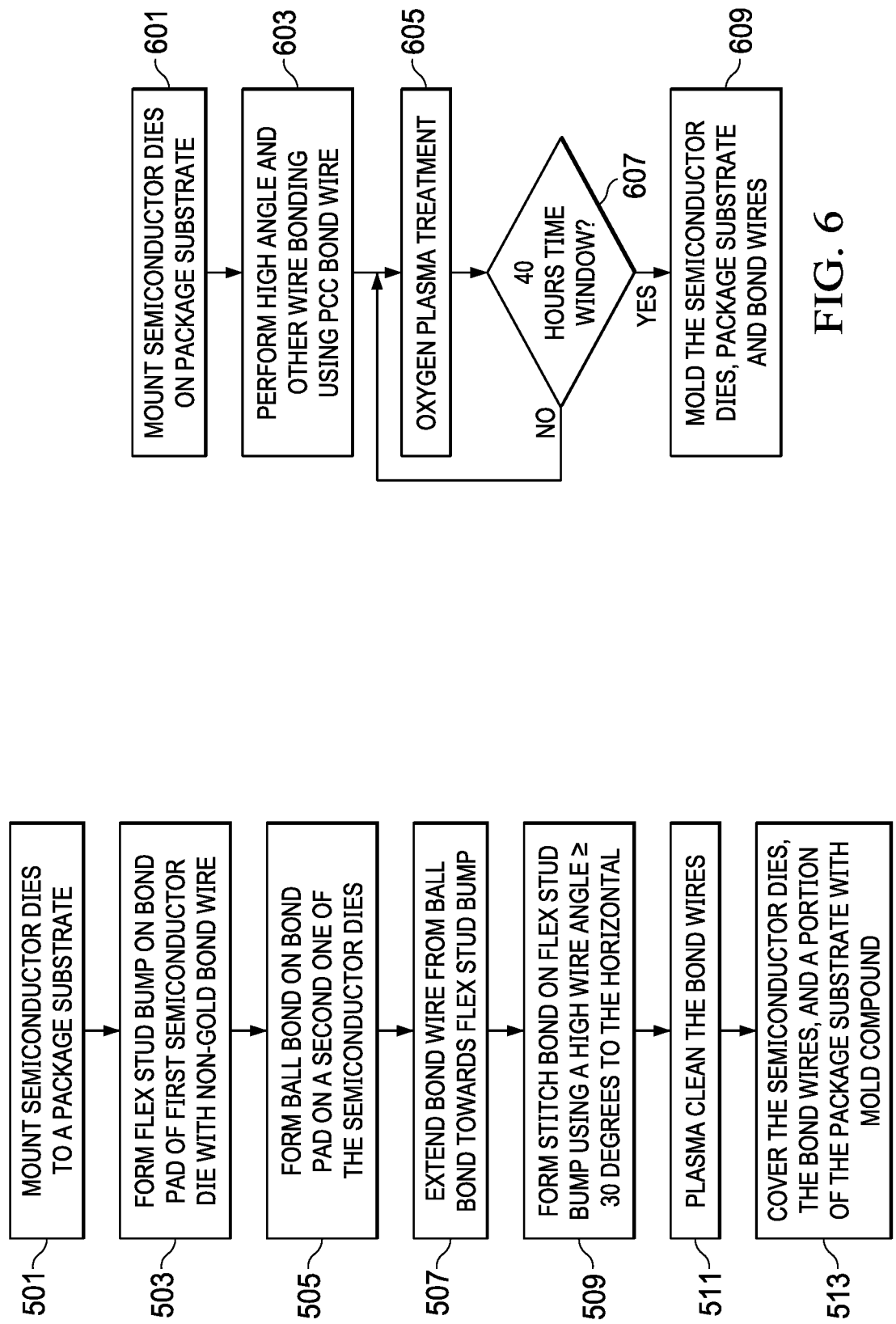

SEMICONDUCTOR DEVICE PACKAGES WITH HIGH ANGLE WIRE BONDING AND NON-GOLD BOND WIRES

TECHNICAL FIELD

This relates generally to packaging for semiconductor devices, and more particularly to packaging semiconductor devices with wire bonding connections.

BACKGROUND

Packages for semiconductor devices include electrical connections between devices and/or between devices and a package substrate, such as a conductive lead frame. In high voltage applications where voltages can exceed 1 kV, package substrates can include some portions that are capable of carrying high voltages, and some portions that include devices at low voltages and not capable of carrying the high voltages, which must be isolated from the high voltages. In some semiconductor device packages, multiple semiconductor dies are mounted to isolated lead frame portions, and connections are made from the dies to leads on the lead frame, and some connections are made between the dies. In some packages a high angle is needed between a bond wire and a connection to a bond pad or lead. The high angle of the bond wire approaching a bond pad prevents electrical arcing between a bond wire carrying a high voltage and a die pad, die edge or lead of the package substrate lead frame at another potential, by increasing the distance between these elements. Shorts due to wire sag are also avoided by the high angle.

Gold bond wire is used to form bond wire connections in semiconductor device packages. Gold is very ductile and gold bond wire can form reliable bonds at many bond wire angles. However, gold bond wire is increasingly expensive. Lower cost alternatives include coated copper bond wire, such as palladium coated copper (PCC) bond wire, bare copper bond wire, silver bond wire, and aluminum bond wire. Another slightly more expensive alternative to PCC is gold coated copper wire. PCC bond wire is often used. PCC bond wire is not capable of high angle stitch bonds. For wire bonded packages where a high angle stitch bond is needed, for example for a die to die wire bond connection in the packaged device, at least a portion of the bond wires used are typically gold, as copper bond wires cannot make all of the required bonds. Using PCC bond wires (or another lower cost bond wire) and gold bond wires together can reduce costs somewhat over using pure gold bond wires, however the need to use two different bond wire types in a package requires the bonding operation to make two passes, with a wire bonder set up for using two different wire types. Packages made with lower cost bond wires are needed.

SUMMARY

In a described example, an apparatus includes: a package substrate having a die mount portion and lead portions spaced from the die mount portion; a semiconductor die over the die mount portion of the package substrate, the semiconductor die having bond pads on an active surface facing away from the package substrate; non-gold bond wires forming electrical connections between at least one of the bond pads and one of the lead portions of the package substrate; a bond stitch on bump connection formed between one of the non-gold bond wires and a bond pad of the semiconductor die, comprising a stitch bond formed on a flex stud bump, the stitch bond offset from a center of the flex stud bump, the flex stud bump being asymmetric in shape and having a peak at a first vertical height above a planar surface of the bond pad, the peak offset from the center of the flex stud bump, another portion of the flex stud bump across the center of the flex stud bump from the peak having a second height above the planar surface of the bond pad, the second height less than the first height; and dielectric material covering a portion of the package substrate, the semiconductor die, the non-gold bond wires, the bond stitch on bump bond and the flex stud bump, forming a packaged semiconductor device.

BRIEF DESCRIPTION OF THE DRAWINGS

FIG. 4 illustrates in another cross sectional view the flex stud bump of FIG. 3, with a high angle stitch bond formed on the flex stud bump.

FIG. 5 illustrates in a flow diagram a series of method steps for forming an arrangement.

FIG. 6 illustrates in another flow diagram a series of method steps for forming an arrangement.

DETAILED DESCRIPTION

Figure 1:
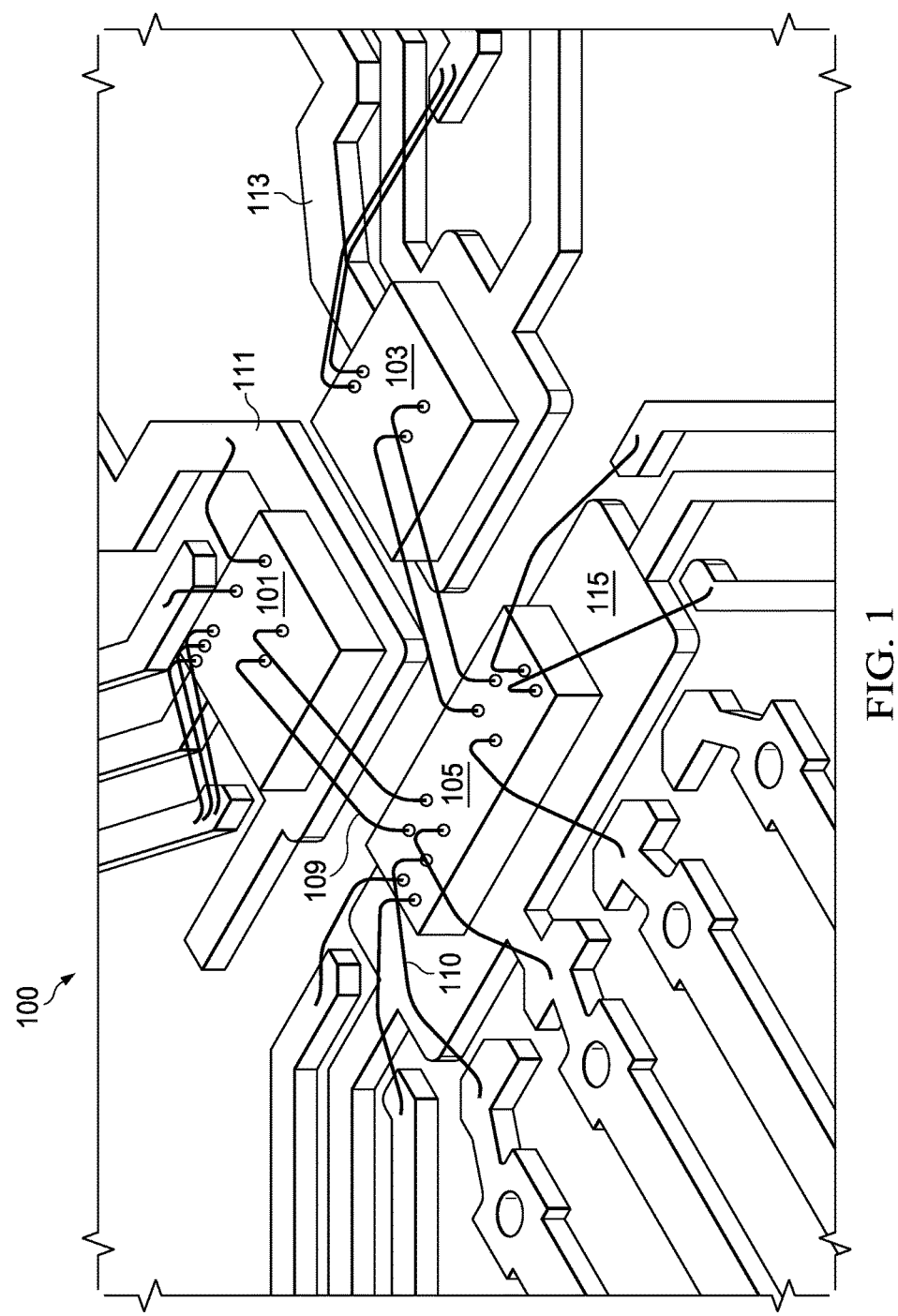
FIG. 1 is a projection view of an in-process packaged device with multiple semiconductor dies mounted on a package substrate, and connected with wire bonds.

Corresponding numerals and symbols in the different figures generally refer to corresponding parts, unless otherwise indicated. The figures are not necessarily drawn to scale.

The term "semiconductor device" is used herein. As used herein, a semiconductor device is a device manufactured using semiconductor material. The semiconductor device can be a discrete component such as a resistor, inductor, capacitor, coil, diode or other passive element. The semiconductor device can be one or more transistors. The semiconductor device may include several or even thousands of transistors and may be referred to as an "integrated circuit". The semiconductor device can be a circuit. Examples include analog and digital circuits such as filters, analog to digital converters, digital to analog converters, sensors, power transistors, power supplies, charge pumps, switches, photocells, transducers, diodes, bulk acoustic wave devices, antennas, receivers, transmitters, transceivers, processors, digital signal processors, amplifiers, shifters, counters, clock circuits, phase locked loops, microcontrollers, bus drivers, and systems on a chip, memory devices, registers, volatile and non-volatile storage circuitry, and other integrated circuits. The term "semiconductor die" is used herein. As used herein, a semiconductor die is a single semiconductor device. The term "packaged semiconductor device" is used herein. As used herein a packaged semiconductor device is a semiconductor die in a protective package, such as a plastic, resin or molded package.

The term "active surface" is used herein in reference to a surface of a semiconductor device die. An active surface of a semiconductor device die is a surface with components formed on it using semiconductor manufacturing processes such as ion implants, oxidation, anneal, chemical and vapor deposition, etch, photolithography, plating, and other processes used to form semiconductor devices. "Bond pads" are described herein. Bond pads of a semiconductor device are conductive pads formed on the active surface that provide electrical connection to the components in the semiconductor device.

The term "package substrate" is used herein. A package substrate is a substrate that supports a semiconductor device die within a device package. Examples of package substrates include leadframes, pre-molded leadframes (PMLF), molded interconnect substrates (MIS), circuit boards, laminate, film and tape substrates, and semiconductor substrates.

In this description, when the term "coupled" describes relationships between elements, "coupled" is not limited to "connected" or "directly connected," but may also include connections made with intervening elements, and additional elements and various connections may exist between any elements that are "coupled."

In this description, the term "high voltage" is used. In some semiconductor devices, a transistor or other device is coupled to a voltage that is considered "high" compared to voltages typically used for semiconductor devices. As used herein, a "high voltage" is one that is greater than about 100 Volts, and can be as much as several hundred or even thousands of volts in some applications. In an example application, a semiconductor die operates at 1.5 kV and is capable of 12 kV surge voltages and 8 kV transient peak over voltages when a switching operation occurs. As used herein, a "low voltage" is less than or equal to 100 Volts. Many logic devices used in integrated circuits operate at voltages such as 1.2, 2, 3.3, 5, 6, 12 and 20 Volts. Automotive devices can operate at 12 Volts, or less, as that is the voltage supplied by the battery. In some example arrangements, some semiconductor dies in a device package are configured to operate at a high voltage, while, some other semiconductor devices are configured to operate at a low voltage, all the devices placed in the same package. In these example arrangements, bond wires couple some signals between the two types of devices, but importantly the bond wires carrying a high voltage must be placed to avoid arcing to a surface at another potential, which requires a high angle for the bond wire. The low voltage devices are isolated from the high voltages within the package.

The term "high angle" is used herein in describing bond wire connections. As used herein, the term "high angle" means that an angle taken between a bond wire extending from a bond pad or lead and a horizontal plane parallel to the surface of the bond pad or lead is greater than or equal to 30 degrees. In some arrangements the high angle can range between 30 and 40 degrees. It is noted that the high angle is subject to manufacturing tolerances, which can create some expected variance. As used herein, a high angle of 30 degrees includes a manufacturing tolerance of +/−10%, so that when an angle is intended to make a high angle of 30 degrees, a measured bond wire angle of 27 degrees would be included in the term "high angle", as would a measured angle of 33 degrees, or any angles between these. When it is intended that the bond wire angle made be greater than or equal to 30 degrees, it is a high angle for the bond wire.

In this description, wire bonds are described as "ball bonds" or "stitch bonds". When bond wire is used to form connections in semiconductor packaging, a wire bonder uses a capillary tool. A bond wire extends through the a hole in the capillary. The capillary has several functions. One is to move the bond wire from point to point, letting it loop or arc as it extends through the capillary opening. The capillary also has the ability to make bond connections to conductive bond pads. The wire extends through a capillary that is used to apply pressure, vibration, increased temperature, and/or ultrasonic energy to the wire to form bonds on the bond pads. The capillary can cut or break the bond wire after a bond is made. Further, after making a bond and cutting the bond wire, a ball can be formed at the end of the bond wire by using heat or flame energy. The ball at the end of the bond wire is then placed and bonded to a bond pad, and the bond wire extends from the ball as the capillary moves to a second bond pad or conductive lead. A stitch bond is then made with the bond wire by applying pressure and energy, and breaking the wire while bonding it onto the second bond pad. The capillary can have clamps that grab the bond wire and the capillary can break the bond wire. In this way a wire connection extends between a ball bond, which has the ball at the bond pad end, and a stitch bond, which does not have a ball at the bond pad. The "ball and stitch" bonding operation is rapidly repeated across the devices to make connections. Connections can be made from a bond pad on a die to a conductive surface on a package substrate, such as a lead of a lead frame, or a conductive land on a laminate or molded interconnect substrate. Connections can also be made from die to die, such as from a high voltage semiconductor die to a low voltage semiconductor die in an isolated device package. In some wire bonders, a "reverse" bond can be made where a ball bond is made on a package substrate conductive land or surface, and a stitch bond is made on a semiconductor die bond pad. When connections are made between semiconductor dies using wire bonds, one of the connections may be a stitch bond.

In this description, "stud bumps" are described. A wire bonder can be used to make stud bumps. In the arrangements, stud bumps improve a stitch bond, by making a "bond stitch on bump" or "BSOB" bond. The stud bump is formed using a ball bond operation. A ball is formed at the end of the bond wire extending from the capillary by melting the bond wire and allowing a free air ball to form, and the ball is then bonded to a bond pad using compression, thermocompression, and/or ultrasonic energy. As the capillary is raised from the top of the ball, the capillary moves so that the extending bond wire is folded onto the ball and then cut, leaving a pyramidal or cone shaped stud bump with a peak in the central portion. The wire bonder can then later make a stitch bond onto the stud bump, the stud bump raising the plane vertically for the stitch bond. The stud bump is essentially similar to a ball bond, which is very reliable, and use of the stud bump with the stitch bond made to it can make the wire bonding operation more reliable than a stitch bond alone. In the arrangements, a bond stitch on bump operation is used to connect a bond wire to a bond pad on a semiconductor die, which can be used to make a die-to-die bond wire connection.

In this description, the term "flex stud bump" is used. As used herein, a flex stud bump is a stud bump formed with a peak portion that is offset from the center of the stud bump when viewed from above. In the arrangements, the flex stud bump is used to make a high angle stitch bond using a copper or other type of non-gold bond wire. The peak of the flex stud bump is formed on one side offset from the center of the flex stud bump. Another portion of the flex stud bump has a lower height than the peak and is opposite the peak, also offset from the center when viewed from above. A sloping surface of the flex stud bump extends from the lower portion upwards to the peak.

In this description the term "non-gold bond wire" is used. As used herein, a non-gold bond wire is any bond wire that is not gold bond wire. Examples useful in the arrangements include palladium coated copper (PCC) bond wire, bare copper bond wire, gold coated copper bond wire, silver bond wire, and aluminum bond wire. All of these non-gold bond wires are lower cost than pure gold bond wire.

In the arrangements, a package for multiple semiconductor dies includes high angle wire bond connections made with non-gold bond wires, such as PCC bond wires. Alternative arrangements can use bare copper bond wire, gold coated copper bond wire, silver bond wire, or aluminum bond wire. In some packaged devices, high angle wire bond connections are needed between a bond wire and a semiconductor die bond pad. The high angle for the bond wire prevents or reduces the likelihood of electrical arcing between the bond wire and other conductive surfaces. In the arrangements, a wire bonder tool is used to make a flex stud bump on a bond pad. A stitch bond is then formed on the flex stud bump on the bond pad. As the stitch bond is made, a capillary of the wire bonder tool that carries the wire is intentionally offset from the center of the flex stud bump by a predetermined distance towards the interior of the die, and a stitch bond is made. The bond wire extends away from the stitch bond and along the sloped surface of the flex stud bump. The resulting stitch bond has a bond wire angle between a horizontal plane parallel to the planar surface of the bond pad on the semiconductor die and the wire extending from the stitch bond of greater than 30 degrees, and in various arrangements, at an angle between 30 and 40 degrees. The high angle increases the distance between the bond wire extending from the stitch bond and the die pad surface and the die edge, reducing the likelihood of arcing. The use of the offset stitch bond on the flex stud bump enables the high angle bond to be made with lower cost bond wires, such as PCC bond wire, bare copper bond wire, and gold coated copper bond wire; in addition alternative non-gold bond wires such as silver and aluminum can be used.

In an example arrangement, a palladium coated copper (PCC) bond wire is used. In alternative arrangements, bare copper bond wire, gold coated copper bond wire, silver bond wire or aluminum bond wire can be used. By combining a lower cost non-gold bond wire and using the high angle stitch bond formed on the flex stud bump, a semiconductor package for high and low voltage semiconductor dies can be made without the need for gold bond wires, reducing costs over pure gold wire approaches, and increasing efficiency of manufacture over hybrid dual wire approaches, lowering per unit cost. Use of the arrangements is possible without the need for changes to an existing package design, or to the placement of bond pads on the semiconductor dies, making the arrangements easy to implement and at low cost.

In an analysis of package materials and relative costs, it was determined that the gold bond wire is a significant percentage of the cost for a completed packaged device, at about 5% of the total costs of a pure gold wire package. The analysis demonstrated that using PCC bond wires in place of gold wire in an example packaged device can reduce the bond wire costs by 90%, and can reduce the overall package costs by 14-18% of total package cost (when compared to the same device in a pure gold bond wire package).

FIG. 1 illustrates in a projection view a workpiece in process, where a package substrate, a lead frame in this example, has three portions 111, 113, and 115. Semiconductor dies 101, 103 and 105 are mounted on die pads of the three lead frame portions 111, 113, 115. The semiconductor dies can be configured to operate at different voltages, for example die 105 can be configured to be coupled to a high voltage, such as a voltage greater than 100 Volts, and in some examples up to 1 kVrms or more, while the remaining dies can be configured to be coupled to lower voltages, for example less than 1 kV, less than 100 Volts, or lower voltages. Bond wires 109 are shown coupling the dies one to another, and additional bond wires 110 couple the dies to leads on the various lead frame portions. The package substrate portions 111, 113, 115, are spaced apart so that the semiconductor dies are electrically isolated from one another, while the bond wires 109 allow signals to be coupled between the electrically isolated dies. As shown in FIG. 1, some of the bond wires 109 connect one bond pad on a semiconductor die to another bond pad on another semiconductor die to form die-to-die connections. In die-to-die connections made with a ball and stitch bond operation, one end of the bond wire connection is a ball bond, while the connection at the other end of the bond wire connection is a stitch bond, such as bond stitch on bump.

Figure 2:
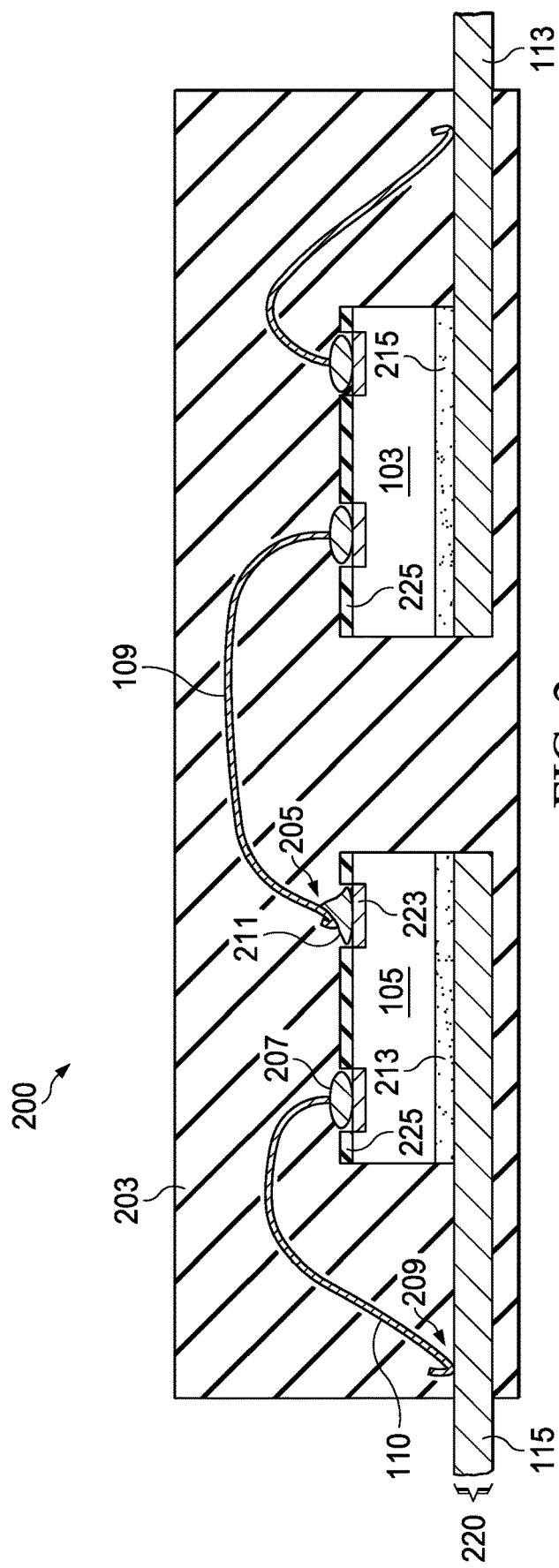
FIG. 2 is a cross sectional view of an arrangement for a packaged device having multiple semiconductor dies mounted on a package substrate with wire bond connections from die to die and from die to leads.

FIG. 2 is a cross section of an arrangement for a packaged device 200. In FIG. 2, a dielectric material 203, for example a mold compound, is formed using an encapsulation process around the semiconductor dies 103, 105; the bond wires 109, 110; and covering portions of the package substrate 220. The semiconductor dies 103, 105, are mounted on die pads on the electrically isolated portions 113, 115 of the package substrate 220, in this example a conductive lead frame is used as the package substrate. Example lead frame materials include copper, copper alloys, alloy 42, stainless steel, and steel. Various materials can be plated onto the lead frame including palladium, nickel, gold, silver, tin and platinum. These plated materials can be used to prevent oxidation or corrosion, reduce ion diffusion, and increase solderability. Multiple layer platings such as electroless nickel immersion gold (ENIG) and electroless nickel, electroless palladium, immersion gold (ENEPIG) can be used. Spot plating can be used at particular locations on the lead frame. Stamped, etched, and partially etched lead frames can be used. Die attach material 213, 215 is used to mount the semiconductor dies 103, 105 to die pads of the lead frame portions. Bond wires 110 couple ball bonds on a semiconductor die bond pad 223 to stitch bonds 209 on a corresponding lead frame lead. The bond pads 223 are at an upper level (as the devices are oriented in FIG. 2) of the semiconductor dies 103, 105 and are exposed from a passivation layer 225, which can be an oxide, a nitride, or other dielectric, by bond pad openings in the passivation layer. A flex stud bump 211 is shown on a bond pad 223 with a stitch bond 205. The bond stitch on the flex bump 211 enables a high angle for bond wire 109, which extends from a first bond pad on the semiconductor die 105 to a second bond pad on the semiconductor die 103. The semiconductor dies 103, 105 are electrically isolated from one another. The semiconductor dies 103, 105 can be at different voltage levels, one die can be configured for a high voltage operation, and the other die can be configured to operate at a low voltage.

Figure 3:
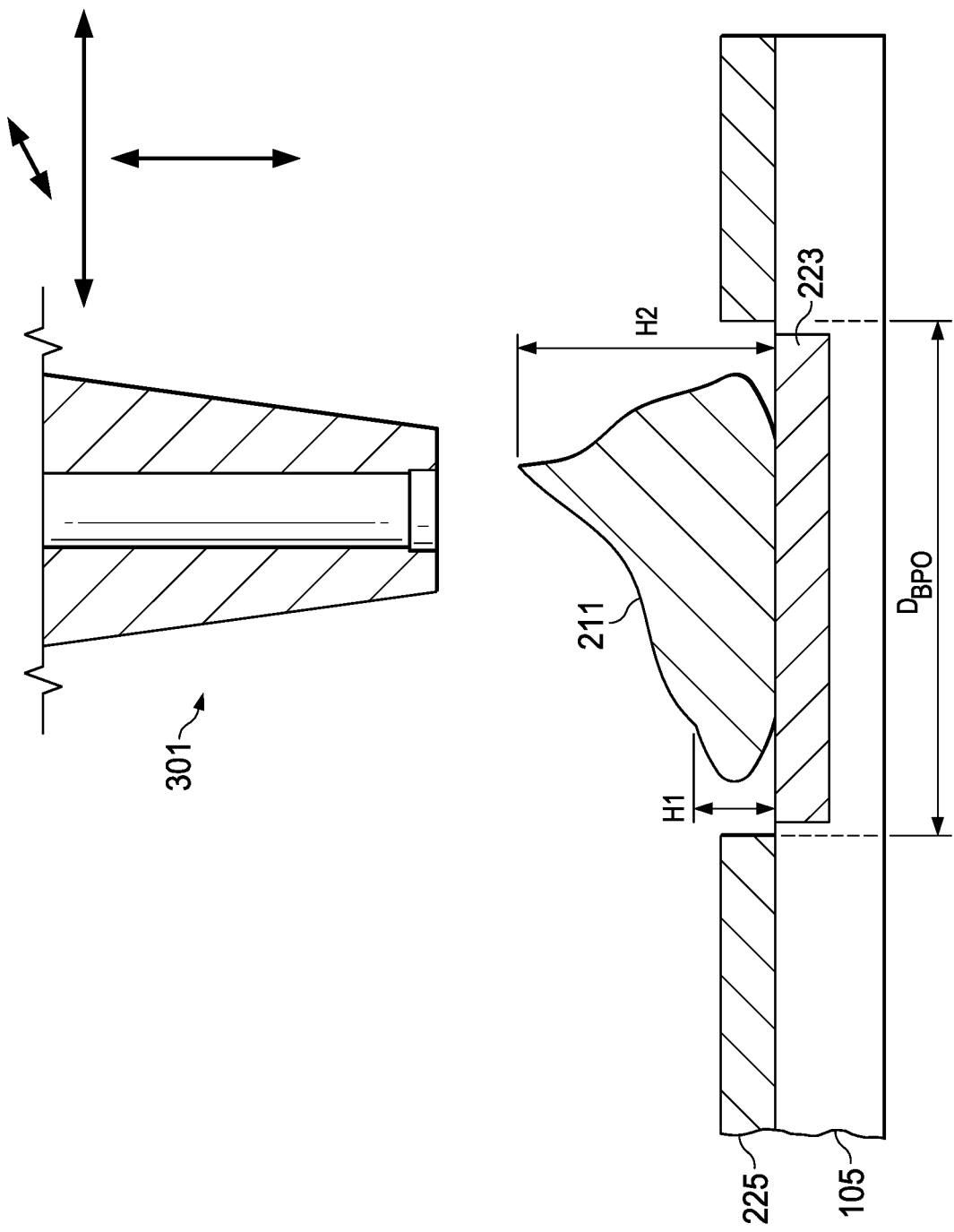
FIG. 3 illustrates in a cross sectional view a capillary and a flex stud bump on a bond pad of a semiconductor die.

FIG. 3 illustrates in a cross sectional view a wire bond capillary 301 of a wire bonding tool, and a flex stud bump 211 that was formed using the capillary 301. To form the flex stud bump 211, the capillary 301 can be moved in three dimensions. Capillary 301 can move up and down, right to left, and back and forth. In an example process, a free air ball is formed at the end of a bond wire extending through the capillary 301. The capillary 301 puts the free air ball on the bond pad 223, pressing the ball onto the bond pad to bond it to the bond pad using pressure, increased temperature, and/or sonic energy. The capillary 301 can then be raised upwards from the ball on the bond pad, and as the bond wire extends through the capillary the bond wire is folded back onto the ball to form the flex stud bump. The capillary moves upwards and away from the bond pad 223 to form flex stud bump 211 with an asymmetric pyramidal shape. The peak of the flex stud bump 211 has a height 'H2.' The peak is off center from the center of the bond pad 223, and on the side of the bond pad closest to a die edge, towards the direction a bond wire will need to extend away from the flex stud bump 211. The flex stud bump 211 has a smaller height 'H1' on the opposite side of the center of the flex stud bump, so that the flex stud bump 211 has an angled sloped surface that extends from the smaller height H1 to the larger height H2. The flex bump 211 has a shape that supports the formation of a high angle bond wire connection using a bond stitch on bump connection.

FIG. 3 also illustrates a bond pad opening diameter $D_{BPO}$. In using the high angle bond wire connections of the arrangements, including copper or another non-gold bond wire and the flex stud bump, the bond pad opening diameters may be increased (when compared to bond pad openings used for a gold bond wire of similar diameter). The increased bond pad opening is used to prevent the capillary 301 from damaging the passivation layer 225 when the flex stud bump and the stitch bond (described below) are formed. The copper bond wire or the PCC bond wire used in arrangements is less ductile than a gold bond wire of the same size. In examples, a gold bond wire of about 1 mil in diameter was compared to PCC bond wire. In an example arrangement, a package that had been formed using 1 mil diameter gold wire was made using the flex stud bumps of the arrangements with 0.8 mil diameter PCC bond wire. The bond pad opening diameter in the example arrangement was 75 microns. PCC bond wire is less ductile than gold so a smaller diameter wire is used to obtain similar flexibility. The smaller bond wire diameter can allow some reduction in bond pad area, a benefit in some package designs. In some arrangements, a semiconductor die originally packaged using gold wire can also be used in a package with the PCC bond wire without the need for changing the bond pad designs or bond pad placement, reducing costs of using the arrangements in existing packages. The package substrates, such as a copper lead frame, can also be used with the arrangements without modification, even when the package substrates were previously used with gold wire or with two wire type packages, reducing costs of using the arrangements. While example arrangements used 0.8 mil diameter PCC bond wire, other arrangements could use different sized bond wire, such as 0.6 mil. The resistivity of the bond wires will vary somewhat with diameter, wire material, and coating types, and some simulations can be done to verify the arrangements have sufficient current carrying capacity. The use of parallel bond wires for some signals or power terminals can compensate for any increased resistivity due to the reduction in wire size, or the change in wire type, when compared to the same package formed using gold bond wires.

FIG. 4 illustrates, in another cross sectional view, the flex stud bump 211 after an additional process step. Following the formation of the flex stud bump 211, the capillary 301 is then used to form a ball bond on another semiconductor die (not shown, but see FIG. 2, semiconductor die 103). The bond wire 109 extends from the ball bond and is used to form a stitch bond 231 on the flex stud bump 211. The stitch bond 231 is formed offset from a center of the flex stud bump 211 by an offset distance Dos. The offset distance Dos is greater than the wire diameter and ball diameter, for example, approximately 175% of the bond wire diameter. In one example the offset distance was 1.2 to 1.4 mils, with a wire diameter of 0.8 mils (using PCC bond wire). The stitch bond 231 is formed on the lower height portion of the flex stud bump, with the bond wire lying along the sloped surface portion of the flex stud bump 211 and the bond wire continues away from the flex stud bump at the high angle. The offset distance Dos is arranged to cause the wire to form the high angle bond where the bond wire 109 lies on the sloped surface of the flex stud bump 211 and rises to the peak of the flex stud bump. The wire extends from the peak on the flex stud bump 211 towards the ball bond on a second semiconductor die (not shown) at the opposite end of the bond wire 209 (see FIG. 2). An angle θ, measured between a horizontal plane parallel to the upper surface of the bond pad and the bond wire 109 is between 30 and 40 degrees, a high angle. Use of this high angle bond wire connection enables the bond wire 109 to carry a high voltage without arcing to the semiconductor die 105 or to the die pad of the package substrate 115 beneath the semiconductor die 105.

FIG. 5 illustrates in a flow diagram steps for a method for forming an arrangement. In FIG. 5, at step 501, the method begins by mounting semiconductor dies to a package substrate.

At step 503, the method continues. For the bond pads that will receive a stitch bond on a semiconductor die, the method first forms a flex stud bump on the bond pad (see flex stud bump 211 in FIG. 3). At step 505, a ball bond is formed on a semiconductor die bond pad that will be connected by a wire bond to the flex stud bump (see FIG. 2, die 103, and bond wire 109).

At step 507, the capillary of the wire bonder tool extends the wire from the ball bond to the flex stud bump, making a loop with a high angle at the flex stud bump. At step 509, the capillary forms the stitch bond. The stitch is formed on the flex stud bump and offset so that the stitch bond is at the lower height portion of the flex stud bump, offset from the center of the flex stud bump, and the bond wire lies along the sloped surface of the flex stud bump and extends to the peak which is on the opposite side of the flex stud bump and off set. Using the flex stud bump raises the vertical height of the bond wire as it extends from the stitch bond and enables the high angle wire bond using a non-gold bond wire, in the examples a PCC bond wire is used. (See FIG. 4, wire 109, and flex stud bump 211, with angle θ).

After the wire bonding is complete with the die to die and die to lead bonds made, a clean step is performed, which is detailed in FIG. 6. The semiconductor dies, the bond wires, and a portion of the package substrate are then covered with mold compound, which can be a resin epoxy, and can be a thermoset mold compound that is heated from a solid puck or powder and flowed into a mold, and then cured. Other resins, epoxies, or plastics can be used.

Use of the arrangements provides the capability to make a high angle stitch bond using non-gold bond wires, such as PCC bond wire or bare copper bond wire. Alternative non-gold bond wires include gold coated copper bond wire, silver bond wire, and aluminum bond wire. In an example arrangement, the high angle wire bond connection is used in a device package with die-to-die bond wire connections between high voltage and low voltage capable semiconductor dies. However, in alternative arrangements, a single semiconductor die can be used with a high angle bond wire connection for a non-gold bond wire using a bond stitch on bump. Multiple semiconductor dies can be mounted in a single package with high angle wire bond connections for certain bond pads. Die-to-die connections can be made with high angle bond wire connections using non-gold bond wire, in an example PCC bond wire is used.

FIG. 6 illustrates another aspect of the arrangements. Following the bonding operations, a plasma clean is performed on the non-gold bond wires and the semiconductor dies, prior to molding. For gold bond wires a plasma ash process can use argon (Ar) as a gas. However, it has been observed that for PCC copper bond wire, the Ar molecules can pit the palladium coating, causing corrosion. In the arrangements, oxygen plasma is used to clean the devices. Oxygen does not damage the PCC bond wires. In FIG. 6, the method begins at step 601 by mounting the semiconductor dies on a package substrate. At step 603, wire bonding is performed using PCC bond wire, including high angle stitch on bump bonds, for example for die-to-die bonds. The completed bonded devices are then subjected to a plasma process, using oxygen, for a predetermined time, such as 40 hours. More time or less time can be used. When the time elapses, the molding operation is performed at step 609.

The order of steps shown in FIGS. 5 and 6 can be changed, and additional steps added, while still remaining within the scope of the appended claims. For example, in FIG. 5, additional bonds can be formed without the flex stud bumps, or from a ball bond to a lead as shown in FIG. 2.

Use of the high angle wire bonds of the arrangements allows the use of non-gold bond wires, for example copper bond wire, and in an example PCC bond wire, for all of the wire bond connections in a packaged device. Use of the lower cost non-gold bond wires, instead of gold bond wires, greatly reduces the cost of the package. Use of the arrangements does not require redesign of the semiconductor dies or the package, reducing costs of implementing the arrangements. By combining the flex stud bumps with the non-gold bond wires, high angle wire bonds can be formed with non-gold bond wires. Additional improvements can be obtained by optimizing bond pad opening sizes in the passivation layer to compensate for any spreading of the flex stud bump area using the arrangements. In an example arrangement, a 0.8 mil PCC bond wire was used, but other wire sizes can be used. Bare copper bond wires, gold coated copper bond wire, silver bond wire and aluminum bond wire can be used.

Modifications are possible in the described arrangements, and other alternative arrangements are possible within the scope of the claims.

What is claimed is:

1. An apparatus, comprising:
   a package substrate having a die mount portion and lead portions spaced from the die mount portion;
   a semiconductor die over the die mount portion of the package substrate, the semiconductor die having bond pads on an active surface facing away from the package substrate;
   non-gold bond wires forming electrical connections between at least one of the bond pads and one of the lead portions of the package substrate;
   a bond stitch on bump connection formed between one of the non-gold bond wires and a bond pad of the semiconductor die, comprising a stitch bond formed on a flex stud bump, the stitch bond offset from a center of the flex stud bump, the flex stud bump being asymmetric in shape and having a first peak at a first vertical height above a planar surface of the bond pad, the first peak offset from the center of the flex stud bump, another portion of the flex stud bump across the center of the flex stud bump from the peak having a second peak with a second height above the planar surface of the bond pad, the second height less than the first height; and
   dielectric material covering a portion of the package substrate, the semiconductor die, the non-gold bond wires, the stitch bond and the flex stud bump, forming a packaged semiconductor device.

2. The apparatus of claim 1, wherein the non-gold bond wire bonded to the flex stud bump by the stitch bond extends from the stitch bond at an angle to a horizontal plane parallel to the active surface of the semiconductor die, wherein the angle is in a range between greater than or equal to 30 degrees and less than or equal to 40 degrees.

3. The apparatus of claim 2, wherein the angle is 30 degrees+/−10 percent.

4. The apparatus of claim 2, wherein the angle is 40 degrees+/−10 percent.

5. The apparatus of claim 1, wherein the non-gold bond wire is one selected from palladium coated copper bond wire, gold coated copper bond wire, bare copper bond wire, silver bond wire, and aluminum bond wire.

6. The apparatus of claim 1, wherein the non-gold bond wire is palladium coated copper bond wire.

7. The apparatus of claim 1, wherein the flex stud bump is on a first bond pad of a first semiconductor die, and further comprising a second semiconductor die on another portion of the package substrate, the non-gold bond wire extending from the bond stitch on bump on the flex stud bump to a second bond pad on the second semiconductor die.

8. The apparatus of claim 7 wherein the non-gold bond wire is bonded to the second bond pad by a ball bond.

9. An apparatus, comprising:
   a first semiconductor die on a first portion of a package substrate;
   a second semiconductor die on a second portion of the package substrate, the second portion spaced from and electrically isolated from the first portion, and the first semiconductor die electrically isolated from the second semiconductor die;
   a first bond pad on a first active surface of the first semiconductor die facing away from the package substrate;
   a second bond pad on a second active surface of the second semiconductor die facing away from the package substrate; and
   a non-gold bond wire bonded to the second bond pad by a ball bond, and extending to the first bond pad, the non-gold bond wire bonded to a flex stud bump on the first bond pad by a bond stitch on bump connection on the flex stud bump, the non-gold bond wire extending from the stitch bond on the flex stud bump at an angle to a horizontal plane parallel to the first active surface of the first semiconductor die, the angle being greater than or equal to 30 degrees and less than or equal to 40 degrees.

10. The apparatus of claim 9, wherein the angle is 30 degrees+/−10 percent.

11. The apparatus of claim 9, wherein the angle is 40 degrees+/−10 percent.

12. The apparatus of claim 9, wherein the first semiconductor die is configured to operate at a voltage greater than 100 Volts, and the second semiconductor die is configured to operate at a voltage less than 100 Volts.

13. The apparatus of claim 9, wherein the non-gold bond wire is one selected from palladium coated copper bond wire, gold coated copper bond wire, bare copper bond wire, silver bond wire and aluminum bond wire.

14. The apparatus of claim 9, wherein the non-gold bond wire has a diameter of less than 1 mil.

15. The apparatus of claim 9, wherein the non-gold bond wire is palladium coated copper bond wire with a diameter of 0.8 mils+/−10 percent.

16. A method, comprising:
   mounting a semiconductor die on a package substrate, the semiconductor die having bond pads on an active surface of the semiconductor die facing away from the package substrate;
   forming a flex stud bump on a first bond pad of the semiconductor die, the flex stud bump having an asymmetrical shape with a first peak with a first height above the first bond pad, the first peak being offset from the center of the flex stud bump and on one side of the flex stud bump when viewed from above, and having a second peak with a second height above the surface of the first bond pad less than the first height on a second side of the flex stud bump opposite the peak;
   forming a bond wire ball on an end of a non-gold bond wire;
   bonding the bond wire ball to a second bond pad;
   extending the non-gold bond wire from the bond on the second bond pad; and
   forming a bond stitch on bump connection between the non-gold bond wire and the flex stud bump, the bond stitch on bump connection having a stitch bond offset from the center of the flex stud bump, the stitch bond being formed on the portion of the flex stud bump at the second height;
   wherein the non-gold bond wire extends from the flex stud bump at an angle to a horizontal plane that is parallel to a planar surface of the bond pad, the angle being in a range from greater than or equal to 30 degrees to less than or equal to 40 degrees.

17. The method of claim 16, wherein the non-gold bond wire is a palladium coated copper bond wire.

18. The method of claim 16, wherein forming the flex stud bump further comprises:
   forming a free air ball at the end of a non-gold bond wire extending from a capillary of a wire bonding tool;
   bonding the ball bond onto the bond pad by pressing the free air ball onto the bond pad using the capillary; and
   moving the capillary as the capillary is raised away from the bond pad to fold the non-gold bond wire onto the surface of the ball to form the flex stud bump, a peak of the flex stud bump being offset from the center of the flex stud bump.

19. The method of claim 16, wherein the semiconductor die is a first semiconductor die, and further comprising a second semiconductor die, and the non-gold bond wire extends to a bond pad on the second semiconductor die, and the ball bond is on a bond pad on the second semiconductor die.

20. An apparatus, comprising:
   a first semiconductor die mounted to a first portion of a package substrate;
   a second semiconductor die mounted to a second portion of the package substrate, the first portion and the second portion being spaced from one another, and the first semiconductor die and the second semiconductor die being electrically isolated from one another;
   a first bond pad on the first semiconductor die;
   a second bond pad on the second semiconductor die; and
   a palladium coated copper bond wire extending from a ball bond connection on the first bond pad on the first semiconductor die to a bond stitch on bump connection on a flex stud bump on the second bond pad on the second semiconductor die, wherein the palladium coated copper bond wire extends from the stitch bond on the flex stud bump on the second bond pad at an angle to a horizontal plane parallel to a planar surface of the second bond pad, the angle being in a range between greater than or equal to 30 degrees and less than or equal to 40 degrees.

* * * * *